(12) United States Patent
Nauleau et al.

(10) Patent No.: US 6,548,878 B1
(45) Date of Patent: Apr. 15, 2003

(54) METHOD FOR PRODUCING A THIN DISTRIBUTED PHOTODIODE STRUCTURE

(75) Inventors: Jean-Luc Nauleau, Los Gatos, CA (US); Wayne T. Holcombe, Palo Alto, CA (US); Pierre Irissou, Sunnyvale, CA (US)

(73) Assignee: Integration Associates, Inc., Mountain View, CA (US)

( * ) Notice: Subject to any disclaimer, the term of this patent is extended or adjusted under 35 U.S.C. 154(b) by 0 days.

(21) Appl. No.: 09/448,861

(22) Filed: Nov. 23, 1999

Related U.S. Application Data

(60) Continuation-in-part of application No. 09/246,264, filed on Feb. 8, 1999, now Pat. No. 6,075,275, which is a continuation-in-part of application No. 09/037,258, filed on Mar. 9, 1998, which is a division of application No. 09/019,079, filed on Feb. 5, 1998, now Pat. No. 6,027,956.
(60) Provisional application No. 60/111,092, filed on Nov. 24, 1998.

(51) Int. Cl.$^7$ .............................................. H01L 27/14
(52) U.S. Cl. ...................................................... 257/431
(58) Field of Search .......................... 257/458, 31, 431, 257/436

(56) References Cited

U.S. PATENT DOCUMENTS

| 3,607,466 A | 9/1971 | Miyazaki | 148/175 |
| 3,676,714 A | 7/1972 | Forst et al. | 317/234 R |
| RE28,032 E | 6/1974 | Scott et al. | 350/211 |

(List continued on next page.)

FOREIGN PATENT DOCUMENTS

| EP | 0 779 661 A2 | 6/1997 |
| GB | 2087181 | 5/1982 |

OTHER PUBLICATIONS

Yamamoto, M., Kubo, M., Nakao, K., "Si–OEIC with a Built–in Pin–Photodiode", *IEEE Transactions on Electron Devices*, vol. 42, No. 1, Jan. 1995, pp. 58–63.
Usami, A., Kaneko, K., Fujii, Y., Ichimura, M., "Evaluation of the Bonded Silicon on Insulator (SOI) Wafer and the Characteristics of PIN Photodiodes on the Bonded SOI Wafer," *IEEE Transactions on Electron Devices*, vol. 42, No. 2, Feb. 1995, pp. 239–243.
Kyomasu, M., Suzuki, T., Okajima, K., and Sahara, M., "An Abnormal Phenomenon Due to Substrate Bias Modulation in the Integrated PIN Photodiode Sensor with Dielectric Isolation," *IEEE*, Mar. 1994, pp. 238–241.
Copy of European Search Report established for European patent application No. 99200543.9.

*Primary Examiner*—Olik Chaudhuri
*Assistant Examiner*—Douglas A. Wille
(74) *Attorney, Agent, or Firm*—Vernon W. Francissen; Gardner, Carton & Douglas

(57) ABSTRACT

A method is shown for producing a distributed PN photodiode having a first active region of the photodiode that can be made arbitrarily thin. A fabrication substrate is doped to have a first conductivity type in order to form the first active region of the photodiode. A layer can also be formed upon the first surface of the fabrication substrate or a first surface of a handling wafer, where the layer can be an oxide layer, where a thickness of the oxide layer can be controlled to form a dielectric refractive reflector, a reflective layer, or a conductive layer. The first surface of the handling substrate is bonded to the first surface of the fabrication substrate. A second surface of the fabrication is then lapped to a obtain a preselected thickness of the first active region. A plurality of second active regions of the photodiode having a second conductivity type is formed on the second surface of the fabrication substrate. A contact having a plurality of connective traces is formed on the second surface of the fabrication substrate, where the connective traces are electrically coupled to the second active regions.

11 Claims, 9 Drawing Sheets

U.S. PATENT DOCUMENTS

| | | | |
|---|---|---|---|
| 3,898,686 A | 8/1975 | Conradi | 357/30 |
| 4,415,803 A | 11/1983 | Muoi | 250/214 |
| 4,425,551 A | 1/1984 | Blackmer et al. | 330/261 |
| 4,521,798 A | 6/1985 | Baker | 357/30 |
| 4,625,225 A | 11/1986 | Goodfellow et al. | 357/30 |
| 4,764,732 A | 8/1988 | Dion | 330/59 |
| 4,814,724 A | 3/1989 | Tanigawa | 330/288 |
| 4,835,595 A | 5/1989 | Oho et al. | 357/30 |
| 4,839,610 A | 6/1989 | Mazzucco et al. | 330/278 |
| 4,847,210 A | 7/1989 | Hwang et al. | 437/3 |
| 4,878,031 A | 10/1989 | Main | 330/254 |
| 4,952,867 A | 8/1990 | Answerson et al. | 323/273 |
| 4,961,097 A | 10/1990 | Pirasthfar et al. | 357/30 |
| 4,983,251 A * | 1/1991 | Haisma et al. | 156/630 |
| 4,996,501 A | 2/1991 | Sano et al. | 330/279 |
| 5,013,681 A | 5/1991 | Godbey et al. | 437/86 |
| 5,066,993 A | 11/1991 | Miura et al. | 357/23.7 |
| 5,101,253 A | 3/1992 | Muzutani et al. | 357/30 |
| H1137 H | 2/1993 | Easter et al. | 437/62 |
| 5,216,237 A * | 6/1993 | Ritchie et al. | 250/214.1 |
| 5,239,193 A | 8/1993 | Benton et al. | 257/292 |
| 5,243,215 A | 9/1993 | Enomoto et al. | 257/443 |
| 5,329,115 A | 7/1994 | Lim | |
| 5,344,499 A | 9/1994 | Kanbara et al. | 136/258 |
| 5,360,987 A | 11/1994 | Shibib | 257/446 |
| 5,369,799 A | 11/1994 | Tsunoda | 455/234.1 |
| 5,392,171 A | 2/1995 | Kovner et al. | 360/65 |
| 5,408,197 A | 4/1995 | Miyake | 330/129 |
| 5,449,943 A | 9/1995 | Kasai et al. | 257/437 |
| 5,450,035 A | 9/1995 | Kinoshita | 330/129 |
| 5,452,473 A | 9/1995 | Weiland et al. | 455/88 |
| 5,507,023 A | 4/1996 | Suganuma et al. | 455/234.1 |
| 5,587,611 A | 12/1996 | Botka et al. | 257/458 |
| 5,598,022 A | 1/1997 | Kyomasu | 257/458 |
| 5,633,526 A | 5/1997 | Kudo et al. | |
| 5,646,437 A * | 7/1997 | Kasai et al. | 257/437 |
| 5,729,038 A | 3/1998 | Young et al. | 257/460 |
| 5,767,953 A | 6/1998 | McEwan | 356/5.01 |
| 5,773,352 A | 6/1998 | Hamajima | 438/406 |
| 5,773,355 A | 6/1998 | Inoue et al. | 438/459 |
| 5,793,060 A * | 8/1998 | Morikawa | 257/85 |
| 5,801,084 A | 9/1998 | Beasom et al. | 438/457 |
| 5,821,597 A | 10/1998 | Nakajima et al. | 257/458 |
| 5,963,785 A | 10/1999 | Katoh et al. | 438/33 |

* cited by examiner

METHOD FOR PRODUCING A THIN DISTRIBUTED PHOTODIODE STRUCTURE

This is a Continuation-in-part of prior application Ser. No. 09/246,264 filed Feb. 8, 1999, now U.S. Pat. No. 6,075,275, which is a divisional of Ser. No. 09/019,079 filed Feb. 5, 1998, now U.S. Pat. No. 6,027,956; and is a continuation-in-part of prior application Ser. No. 09/037,258 filed Mar. 9, 1998; and claims the benefit of provisional application No. 60/111,092 filed Nov. 24, 1998.

BACKGROUND OF THE INVENTION

1. Field of the Invention

The present invention is directed toward an improved manufacturing process for a producing a high speed PN photodiode having a distributed photodiode structure and the resulting photodiode.

2. Description of the Related Art

Photodiodes are diodes in which charge carriers are generated responsive to light incident upon the photodiode. Any PN junction diode which admits light can function as a photodiode. A photodiode outputs voltage or current when absorbing light. In a photodiode which is intended for high speed communication systems, it is important to optimize the performance for light conversion efficiency, speed (minimal transit time delay), minimum RC time constant, ability to operate at low reverse bias voltage, and cost in the application in which the photodiode will be employed.

The structure of a conventional discrete PIN photodiode 24 is illustrated in FIG. 1B. A wafer 50 is lightly doped with N dopant in order to produce an intrinsic region 56. A P+ region 52 is formed on one surface of the wafer and an N+ region 58 is formed on the opposing surface of wafer 50 with intrinsic region 56 interposed P+ region 52 and N+ region 58. A reflective layer 60, typically gold, is disposed on the surface containing P+ region 58 with reflective layer 60 also serving as the electrical contact to N+ region 58. A metal contact 54 is disposed on the surface containing P+ region 52 to provide the electrical connection to the P+ region.

Typically, one power supply potential is applied to the reflective layer 60 and another power supply voltage is applied to contact 54 to reverse bias the PN junction formed by P+ region 52 and N+ region 18. This forms a large depletion region within the intrinsic region 56 wherein electron and hole charge carrier pairs generated by light photons incident upon the intrinsic region 56 are rapidly accelerated toward the P+ and N+ regions respectively by the electric field of the reverse bias voltage. Charge carrier pairs are also typically generated outside the depletion region within intrinsic region 56 which diffuse, due to random thermal motion of the carriers, at a much slower velocity until they reach either the depletion region or the junction formed by P+ region 52 and intrinsic region 56 of photodiode 24.

A conventional photodiode that is designed for high quantum, i.e. light conversion, efficiency requires that the light path within the photo current collection zone, i.e. the depletion and non-depletion zones within intrinsic region 56, be sufficient in length so that most of the light photons of the incident light signal area are absorbed and converted into electron-hole pairs that are collectable at the P+ and N+ regions. Usually, this requires that the width of the intrinsic region 56, which is the primary light collection region, be several times the length required for light absorption. If diode 10 has an efficient back-side reflector, such as reflective layer 60, which effectively doubles the light path within diode 24, then the intrinsic region 56 of the photodiode can be made narrower. For a typical near infrared silicon photodiode, the nominal absorption path length is about 15–25 microns. The path length should be at least two to three times the nominal absorption path length to obtain good light conversion efficiency.

Wafer 50 can be lapped to as thin as 100 microns in order to obtain a thinner intrinsic region 56 and better performance for the resulting PIN photodiode. However, it is generally not practical to thin wafers beyond this limit without an excessive level of wafer breakage along with severe wafer handling and processing problems. As noted above, however, the width of intrinsic region 56 that is optimal for the performance of the photodiode can be as little as 30 microns.

A photodiode designed for high frequency response requires that the photo current pairs generated by the light signal be collected rapidly and that the diode RC time constant is fast. Rapid photo current pair collection usually requires that most of the photo current pairs generated by the light signal be generated with the depletion region formed by the reverse bias voltage because the pairs will have a high drift velocity. Otherwise, the photo generated charge carrier pairs produced in the non-depletion regions within intrinsic region 56 and within diffusion distance of the collection electrodes 52 and 58 will have a diffusion velocity that is several hundred times slower than the velocity of the pairs generated within the depletion zone. The photo generated charge carrier pairs in the non-depletion zones will slowly migrate for collection at P+ region 52 and N+ region 58 resulting in a tall on the trailing edge of the electrical signal corresponding to the light signal. The diffusion distance of the charge carriers is determined by the carrier mean free path before re-combination and may exceed 150 microns.

A fast RC time constant for photodiode 24 requires minimal capacitance and low series resistance between the electrical contacts 54 and 60 and the photo current pair collection sites at the margin between P+ region 52 and the depletion zone and the margin between N+ region 58 and the depletion zone. The greater the width of the intrinsic region 56, the greater the width of the depletion zone and the lower the capacitance per unit area of photodiode 24. Since the width of the depletion zone increases with the magnitude of the reverse bias voltage, it is typical for high speed photodiodes to have a relatively high reverse voltage applied to them.

The inclusion of lightly doped intrinsic region 56 between the P+ and N+ regions 52 and 58 results in a PIN photodiode with a wider depletion region, depending on the magnitude of the reverse bias voltage, which improves the light collection efficiency, increases speed, and reduces capacitance over that of a simple PN diode structure.

The PIN photodiode is typically produced by diffusing the N+ region 58 on the back side of the lightly doped (N) wafer 50, diffusing the P+ region 52 on the topside of the wafer 50, and then adding metal contacts to each side of the wafer. Typically, the backside contact area connected to N+ region 58 is reflective layer 60 and is made of gold. The reflective layer is then typically connected to the ground voltage terminal.

Although a PIN photodiode outperforms a standard PN diode, the PIN photodiode structure cannot be easily manufactured by standard semiconductor processes wherein fabrication is typically performed on only one side of the semiconductor wafer 50. In typical high volume applications, it is now standard practice to fabricate the receiver circuitry and transmitter driver in a single integrated circuit (IC) to produce a transceiver IC. As described above, it is difficult to integrate an efficient photodiode on the same semiconductor substrate as the transceiver circuit. As a result, a discrete infrared photodiode is typically assembled with the transceiver circuit and an LED, along with lenses for the photodiode and LED, into a plastic molded package to form a transceiver module. The transceiver module is designed to be small in size and allow placement in the incorporating electronic device so as to have a wide angle of view, typically through an infrared window on the transceiver casing. The transceiver IC is designed to digitally interface to some type of serial data communications device such as an Infrared Communication Controller (ICC), UART, USART, or a microprocessor performing the same function.

As noted above, any PN junction diode which admits light can function as a photodiode. A PN diode junction can also be fabricated using standard IC processes. However, the photo-current collection region within an electric field, the drift region, in a PN photodiode is limited to the relatively thin depletion zone produced when the PN junction is reverse biased. This thin drift region is much less efficient in the collection of photo-generated charge carrier pairs because most of the pairs are generated outside of the depletion zone. Also, the charge pairs generated outside of the depletion zone thermally diffuse to collection points margins of the P and N layers and into the depletion zone at a much slower relative speed resulting in slow photodiode performance. In addition, the highly doped P and N regions result in high diode capacitance per unit area which further slows the performance of the photodiode.

Accordingly, it is an object of the present invention to produce a PN photodiode having high speed operation.

SUMMARY OF PRESENT INVENTION

The present invention describes an improved method for producing a distributed PN diode featuring an arbitrarily thin intrinsic region which can be depleted at a low operating voltage and multiple active regions distributed across a surface of the photodiode.

An embodiment of a method, according to the present invention, for fabricating a distributed PN photodiode includes providing a first semiconductor substrate doped with a first dopant type, the first semiconductor substrate having first and second planar surfaces. The method then calls for bonding a first surface of a second semiconductor substrate to the first planar surface of the first semiconductor substrate and lapping the second planar surface of the first semiconductor substrate. The method then sets forth selectively masking and diffusing a predetermined portion of the second planar surface of the first semiconductor substrate with a second dopant type to form a plurality of second active regions. The method then requires forming a first oxide layer on the second planar surface of the first semiconductor substrate and selectively masking and etching the first oxide layer to form a plurality of contact holes in the first oxide layer, where each contact hole is formed in communication with one of the plurality of second active regions. The method then recites forming a contact that interconnects each of the plurality of contact holes.

In yet another embodiment of a process according to the present invention, a layer is formed on either the first surface of the first semiconductor substrate or the first surface of the second semiconductor substrate. This layer can be an oxide layer, where the thickness of the oxide layer can be controlled to form a dielectric interference reflector, a reflective layer, or a conductive layer.

BRIEF DESCRIPTION OF THE DRAWINGS

The present invention will be described in the context of the following drawings wherein like structures are identified using like reference numbers.

DETAILED DESCRIPTION OF THE PRESENT INVENTION

FIGS. 2A–F describe an improved PN photodiode fabrication method which utilizes a standard thickness handling wafer with an isolating oxide layer grown on its surface that is bonded to the N+ diffusion side of a fabrication wafer. The handling wafer allows an N+ active region formed in the fabrication wafer to be lapped to a thin thickness, as required for optimum performance of the PN photodiode, while the handling wafer provides mechanical rigidity needed for processing. Multiple P+ regions are then diffused into distributed portions of the lapped surface of the fabrication wafer. Next, contacts are formed that connect the multiple P+ regions. The fabrication and handling wafers are then diced to obtain the finished photodiode. The process can be easily adapted to produce a distributed photodiode with a different polarity having multiple N+ regions on the lapped surface. The process can also be performed using standard IC processing so that the photodiode can be fabricated on the same substrate as a receiver circuit.

Figure 1:
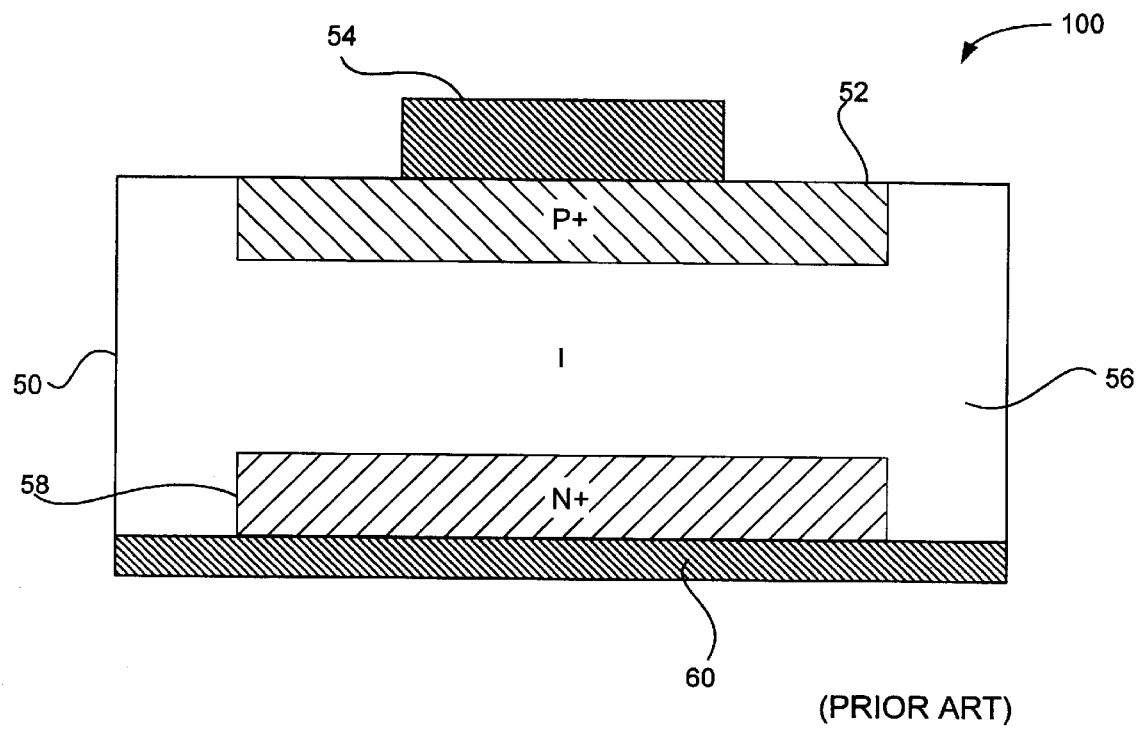
FIG. 1 describes the structure of a conventional PIN photodiode.
Figure 2A:
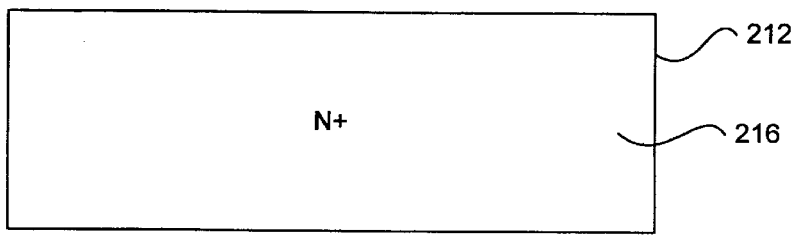
FIGS. 2A–G illustrate a series of steps for an embodiment of a process according to the present invention for producing a distributed PN photodiode having P+ diffusions.

The process begins with fabrication wafer 212 of FIG. 2A, which is N+ doped to form a first active region 216 which will become the N region of a PN diode.

Figure 2B:
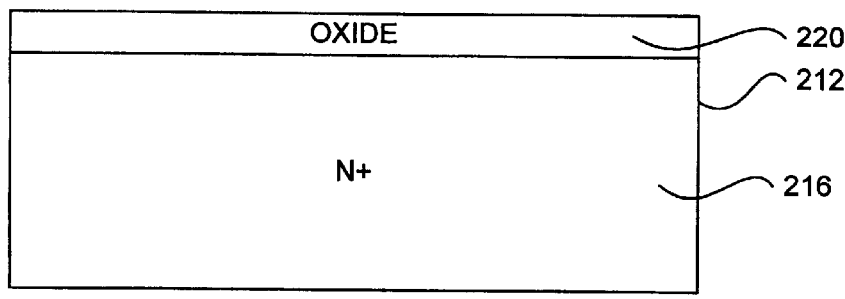

An oxide layer 220 can be formed on the N+ layer 216 on a first planar surface of fabrication wafer 212, as shown in FIG. 2B. Alternatively, the dielectric interference reflector can be formed by producing an oxide layer on a handling wafer 230 discussed below. By controlling the thickness of the oxide layer, a dielectric interference reflector can be produced that will reflect light at a specific wavelength that is desirable for a particular application, i.e. an infrared photodiode for use in an infrared receiver.

A conductive layer can also be formed on either the handling wafer 230 or the fabrication wafer 212. The benefits of adding a conductive layer are described in greater detail below.

Figure 2C:
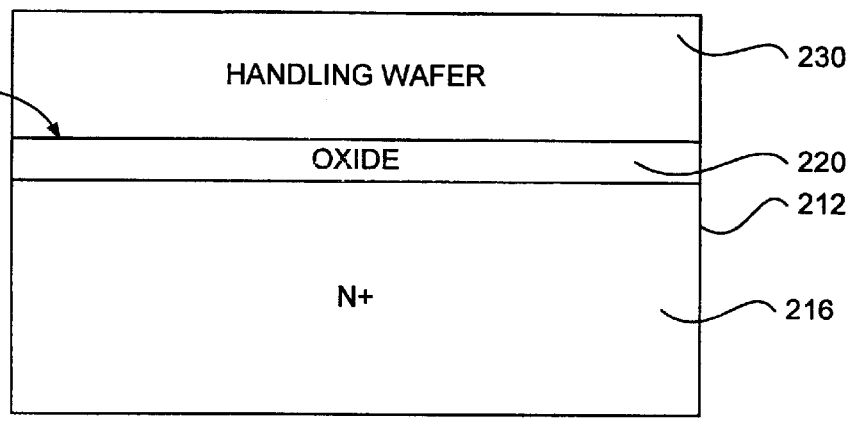

A handling wafer 230 is then bonded to a surface 232 of fabrication wafer 212 that includes the N+ diffusion 216, as shown in FIG. 2C. Bonding is accomplished by polishing the opposing faces of the handling wafer 230 and fabrication wafer 212 to a fine level of planarity. When the resulting highly planar surfaces of the handling wafer 230 and fabrication wafer 212 are subsequently pressed together, the polished surfaces will bind, to some degree, to one another through Van der Waal's cohesive forces. The handling wafer 230 and fabrication wafer 212 will become further bonded during the heating steps associated with subsequent processing steps, such as during the diffusion of dopants. The oxide layer 220 becomes important during these subsequent heating cycles as a barrier between the N+ diffusion 216 and the contaminants that may be present in handling wafer 230. Also, it is important that the handling wafer 230 and fabrication wafer 212 have the same coefficient of thermal expansion to prevent warping or separation of the two wafers during the subsequent heating cycles.

Figure 2D:
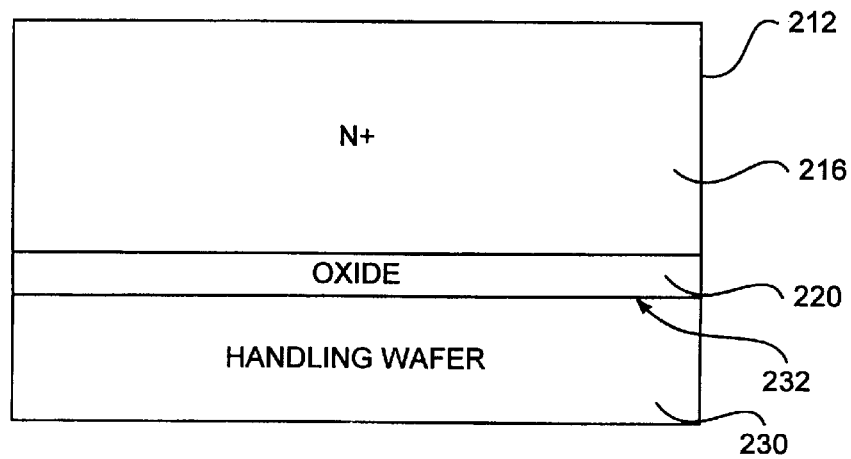
Figure 2E:
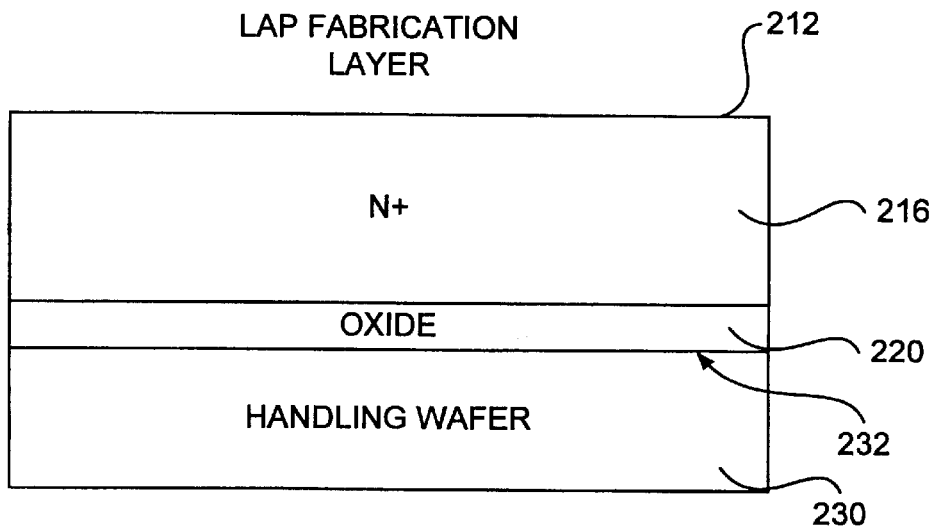
Figure 2F:
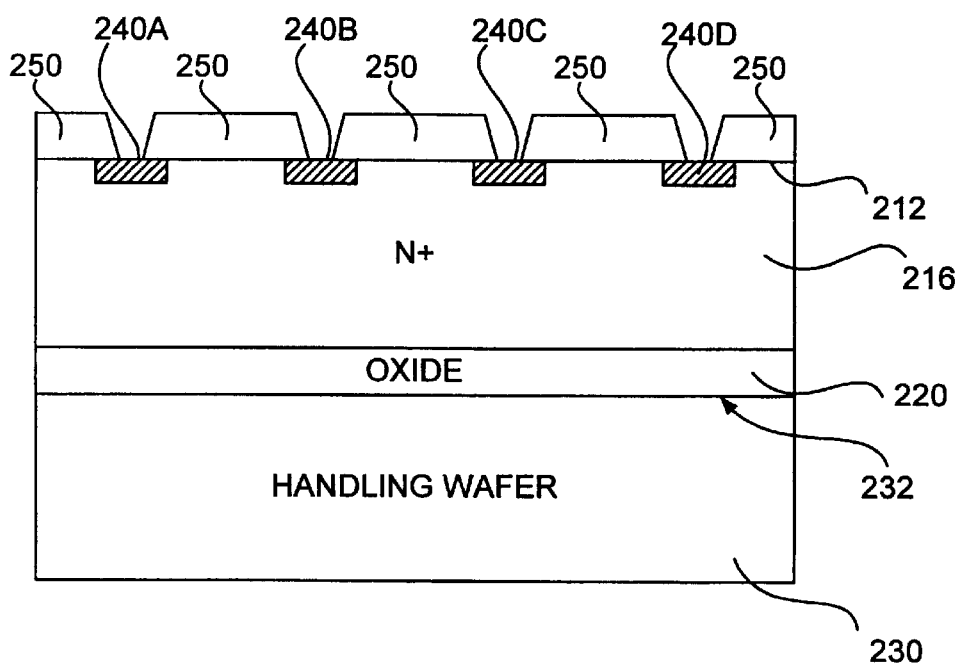

The structure formed by the fabrication wafer 212 bonded to the handling wafer 230 is then flipped, as shown in FIG. 2D, so that further fabrication processing can be performed on fabrication wafer 212. The fabrication wafer 212 can then be lapped, as shown in FIG. 2E, to obtain a desired thickness for the N+ region 216, such as 20–40 microns, for optimal performance of the resulting PN diode.

In the process of the present invention, the thickness of N+ region 216 is not constrained by requirements for mechanical integrity of the fabrication wafer 212 needed for subsequent processing steps, as is the conventional PIN photodiode and process. The handling wafer 230 provides the mechanical integrity needed for the handling required for further processing of the fabrication wafer 212 while the N+ region 216 can be lapped to the optimal thickness for the performance of the PN photodiode.

After the fabrication wafer 212 is lapped, P+ regions 240A–D are diffused into the N+ region 216 of fabrication wafer 212. Oxide regions 250 are fabricated between P+ regions 240A–D with the resulting structure shown in FIG. 2F.

Figure 2G:
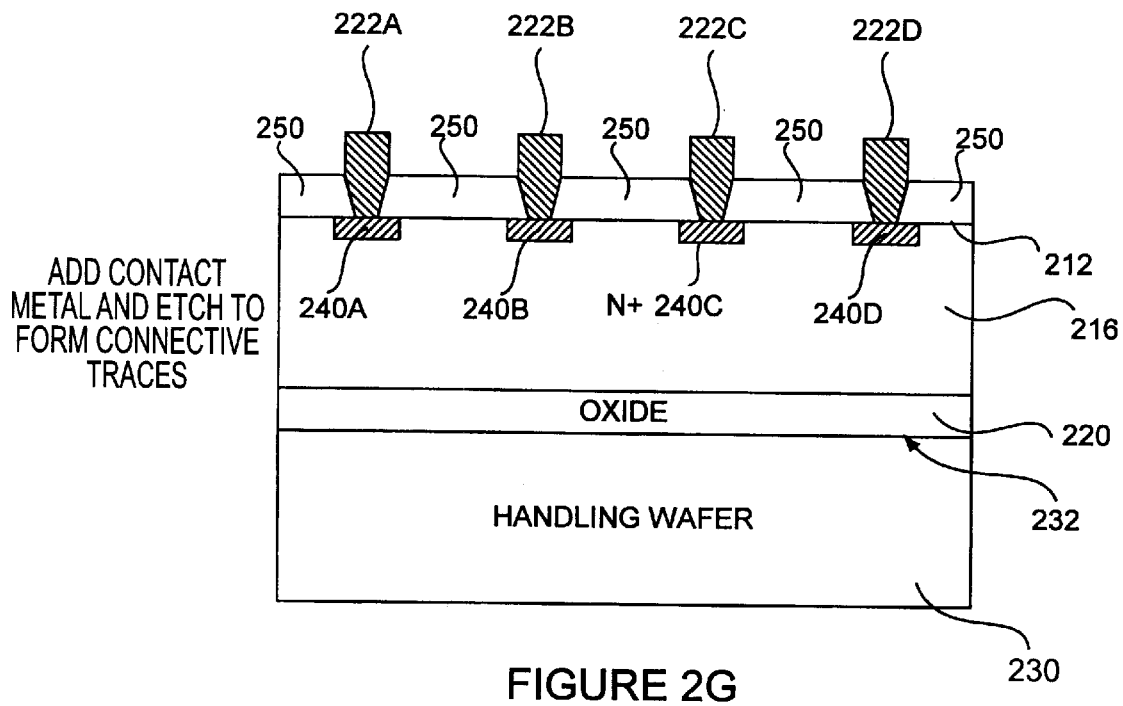
Figure 3:
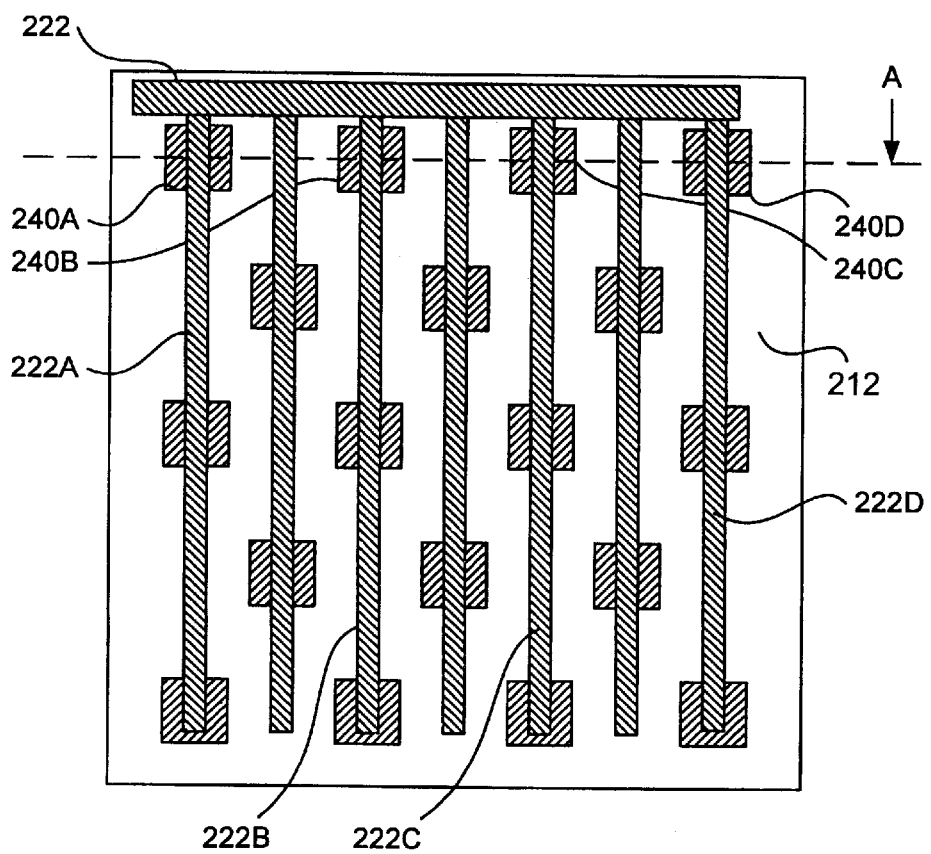
FIG. 3 is a top view of a photodiode according to the present invention produced by the process of FIGS. 2A–G.

Contact metal is added and etched to form contacts 222A–D that are electrically coupled to P+ regions 240A–D to obtain the structure shown in FIG. 2G, which is substantially a cross-section take along the A axis shown in FIG. 3. FIG. 3 is a top view of the photodiode created by the process of FIGS. 2A–G and illustrates the distribution of P+ diffusions on the surface of fabrication wafer 212. Contacts 222A–D are part of a set of contact traces that form contact 222 that connect the distributed P+ diffusion regions for coupling to an input terminal of a receiver. The semiconductor die are then cut from fabrication wafer 212 and handling wafer 230 to form individual distributed PN photodiodes.

The resulting distributed PN photodiode has a thinner N+ region 216 than can be obtained with conventional processes so that the thinner depletion region formed in the diode by lower reverse bias voltage levels will still permit high speed operation. Furthermore, the PN photodiodes produced in this manner can be formed using standard semiconductor fabrication processes, rather than photodiode specific processes.

An embodiment of a process according to the present invention for forming a distributed PN photodiode having distributed N+ regions is shown in FIGS. 4A–G. The process begins with fabrication wafer 312 of FIG. 4A, which is P+ doped to form what will become the P+ active region 216 of a PN diode.

Figure 4A:
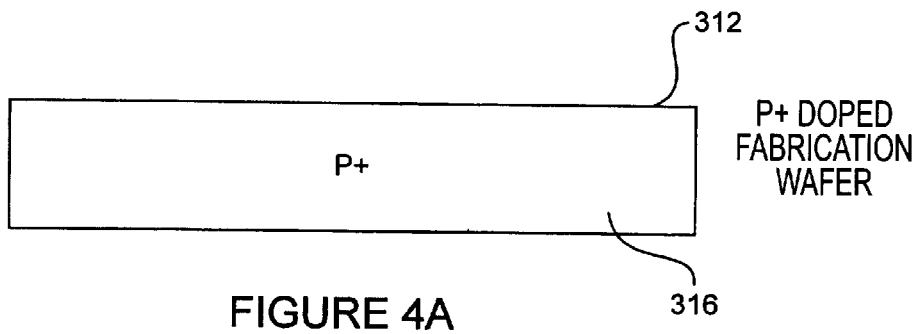
FIGS. 4A–G illustrate a series of steps for another embodiment of a process according to the present invention for producing a distributed PN photodiode having N+ diffusions.
Figure 4B:
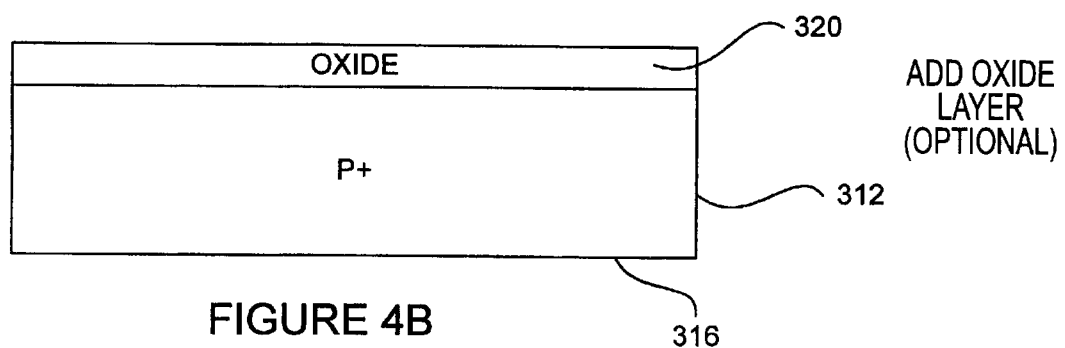

Optionally, an oxide layer 320 can be formed on the fabrication wafer 312, as shown in FIG. 4B. Alternatively, the oxide layer 320 can be formed on a handling wafer 330 discussed below. The thickness of the oxide layer 320 can be controlled during processing in order to form a dielectric interference reflector that reflects a specific frequency of light and improves the light absorption efficiency of the resulting PN photodiode.

Also, a conductive layer can be formed on either the fabrication wafer 312 or the handling wafer 330. The benefits of adding a conductive layer are discussed in greater detail below.

Figure 4C:
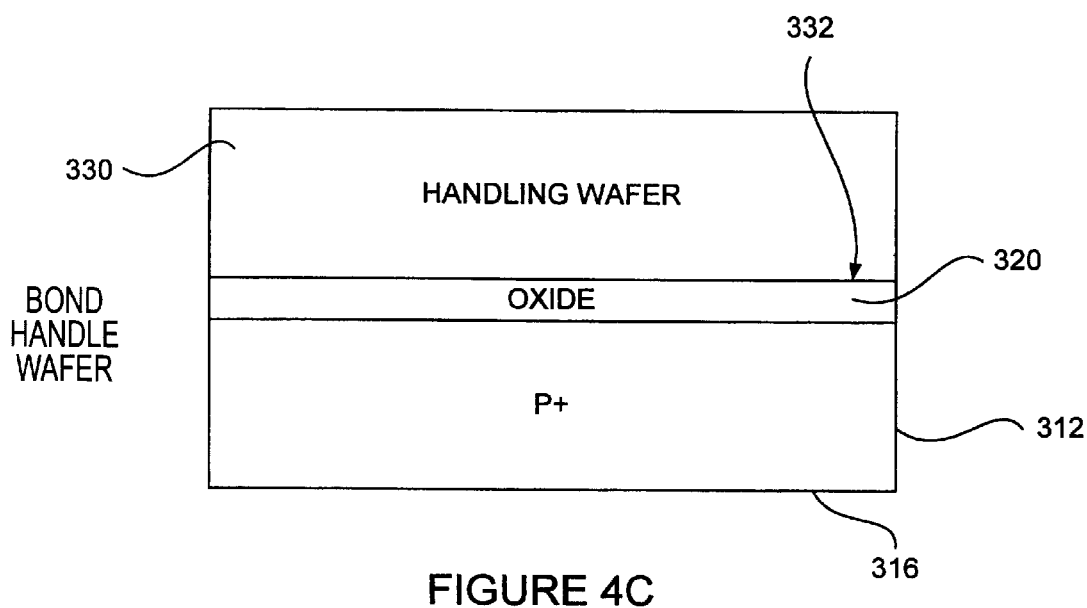

A handling wafer 330 is then bonded to a surface 332 of fabrication wafer 312 that includes the P+ layer 316, as shown in FIG. 4C. Bonding is accomplished by polishing the opposing faces of the handling wafer 330 and fabrication wafer 312 to a fine level of planarity. When the resulting highly planar surfaces of the handling wafer 330 and fabrication wafer 312 are subsequently pressed together, the polished surfaces will bind, to some degree, to one another through Van der Waal's cohesive forces. The handling wafer 330 and fabrication wafer 312 will become further bonded during the heating steps associated with subsequent processing steps, such as during the diffusion of dopants. The oxide layer 320 becomes important during these subsequent heating cycles as a barrier between the P+ region 316 and the contaminants that may be present in handling wafer 330. Also, it is important that the handling wafer 330 and fabrication wafer 312 have the same coefficient of thermal expansion to prevent warping or separation of the two wafers during the subsequent heating cycles.

Figure 4D:
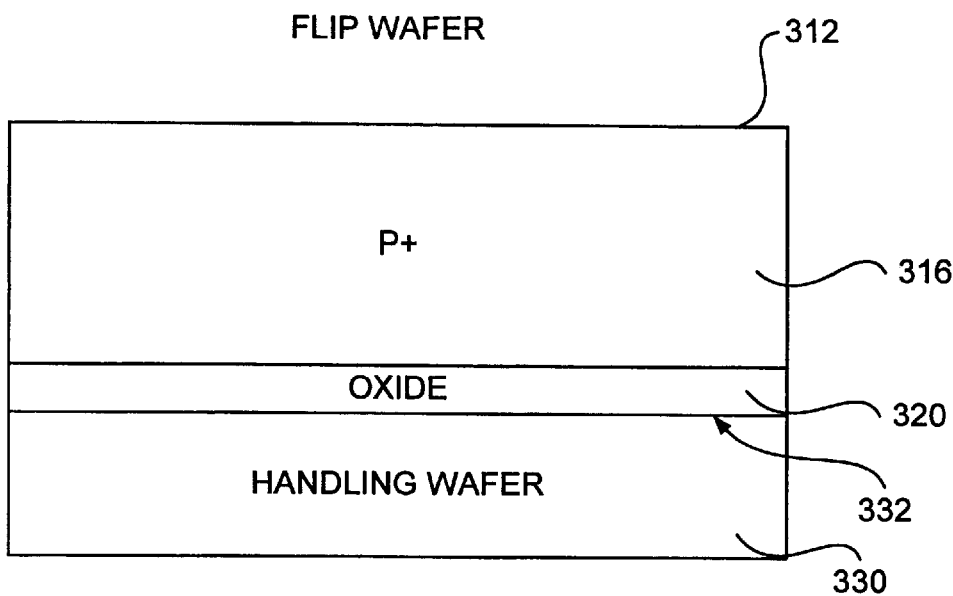
Figure 4E:
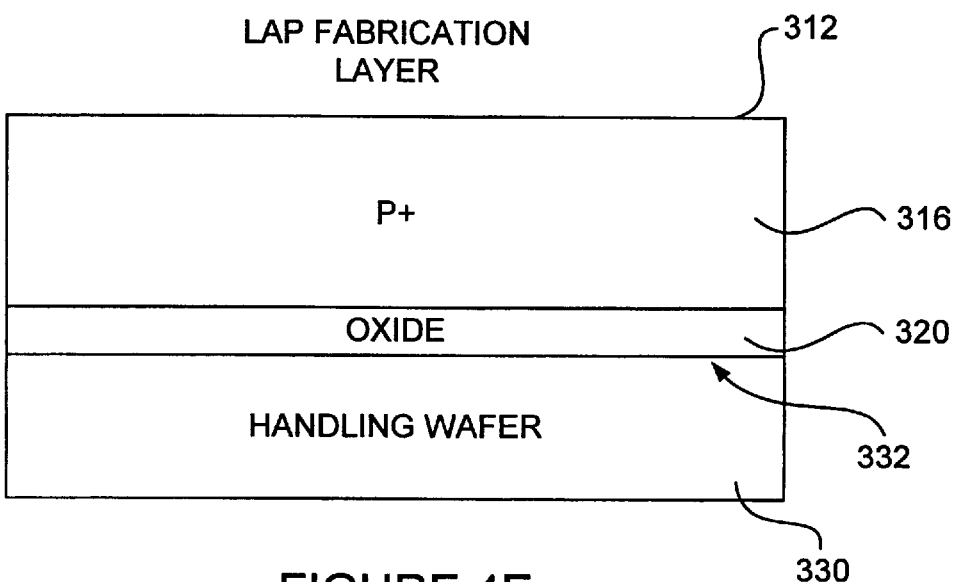
Figure 4F:
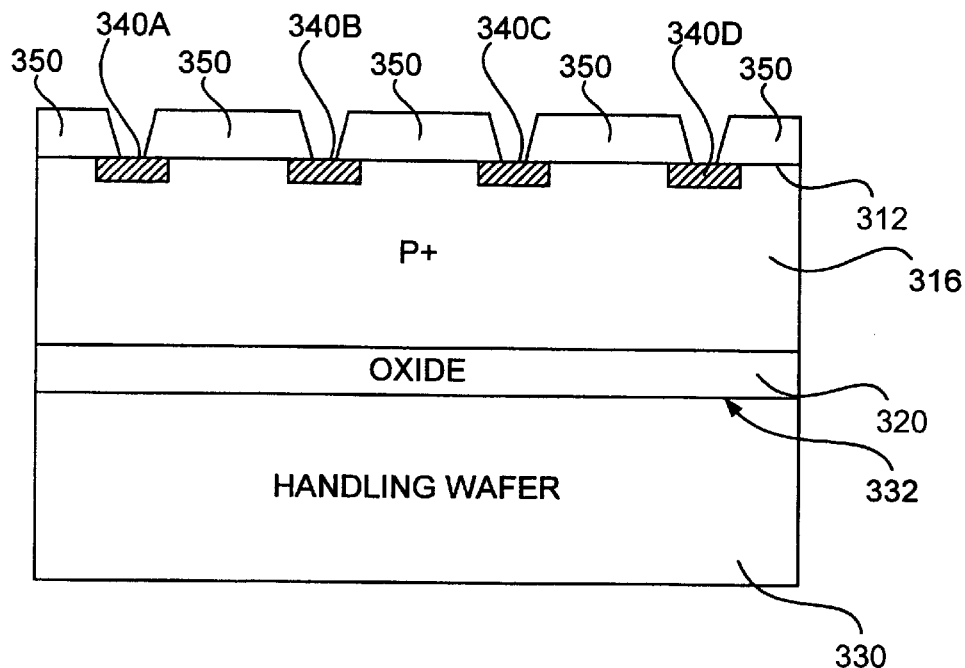

The structure formed by the fabrication wafer 312 bonded to the handling wafer 330 is then flipped, as shown in FIG. 4D, so that further fabrication processing can be performed on fabrication wafer 312. The fabrication wafer 312 is lapped, as shown in FIG. 3E, to obtain a desired thickness, such as 20–40 microns, for the P+ region 316 for the optimal performance of the resulting PN diode.

In the process of the present invention, the thickness of P+ region 316 is not constrained by requirements for mechanical integrity of the fabrication wafer 312 needed for subsequent processing steps, as is the conventional PIN photodiode and process. The handling wafer 330 provides the mechanical integrity needed for the handling required for further processing of the fabrication wafer 312 while the P+ region 316 can be lapped to the optimal thickness for the operation of the PN photodiode.

After the fabrication wafer 312 is lapped, N+ regions 340A–D are diffused into P+ region 316. Oxide regions 350 are fabricated between N+ regions 340A–D with the resulting structure shown in FIG. 4F.

Figure 4G:
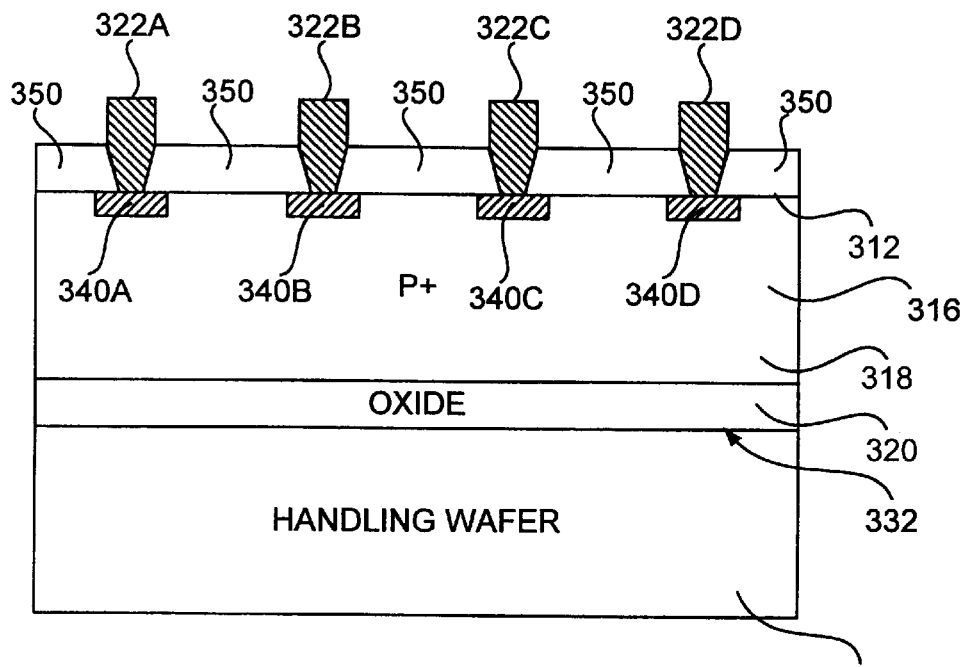
Figure 5:
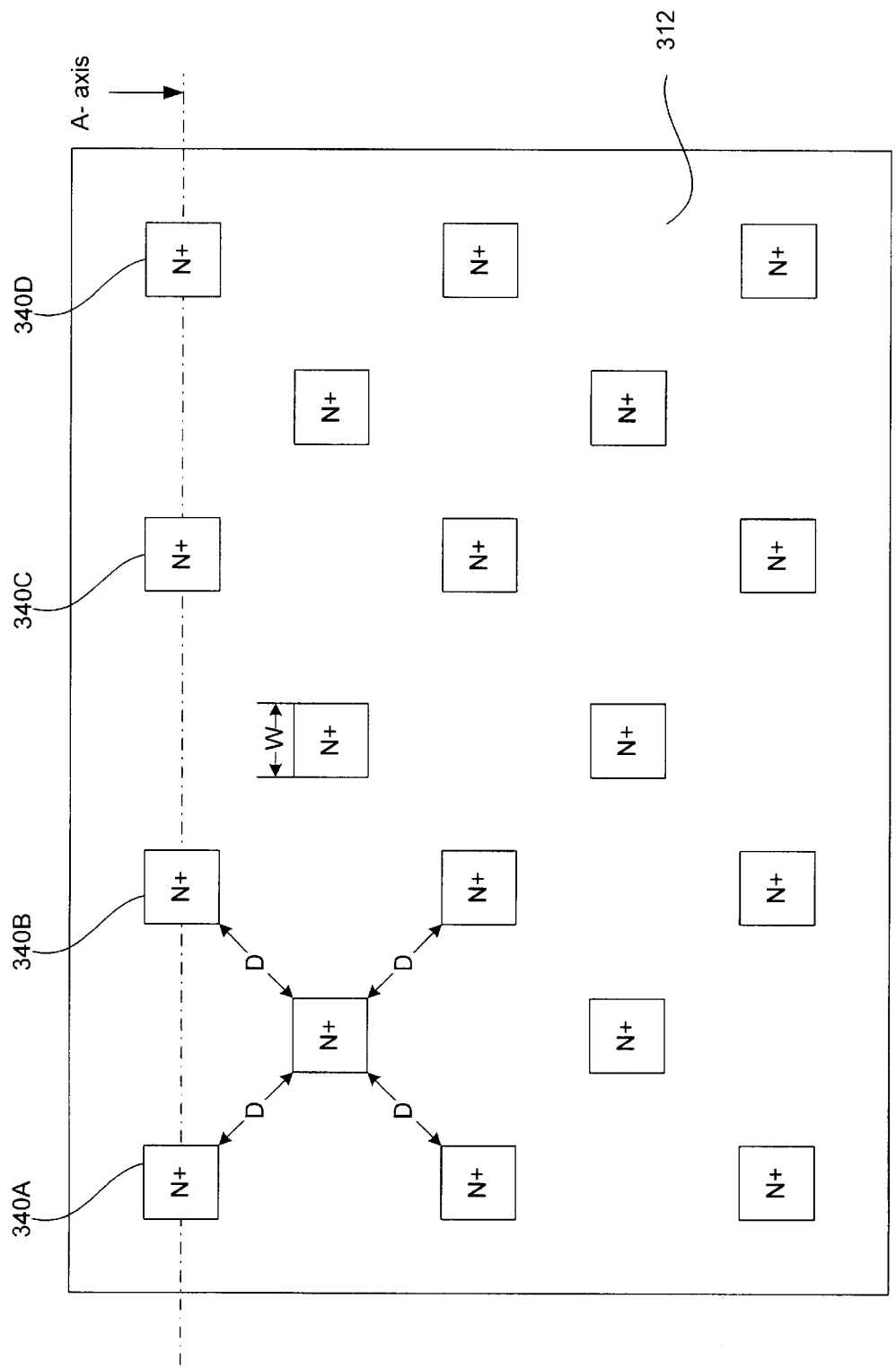
FIG. 5 is a top view of a photodiode according to the present invention produced by the process of FIGS. 4A–G.
Figure 6:
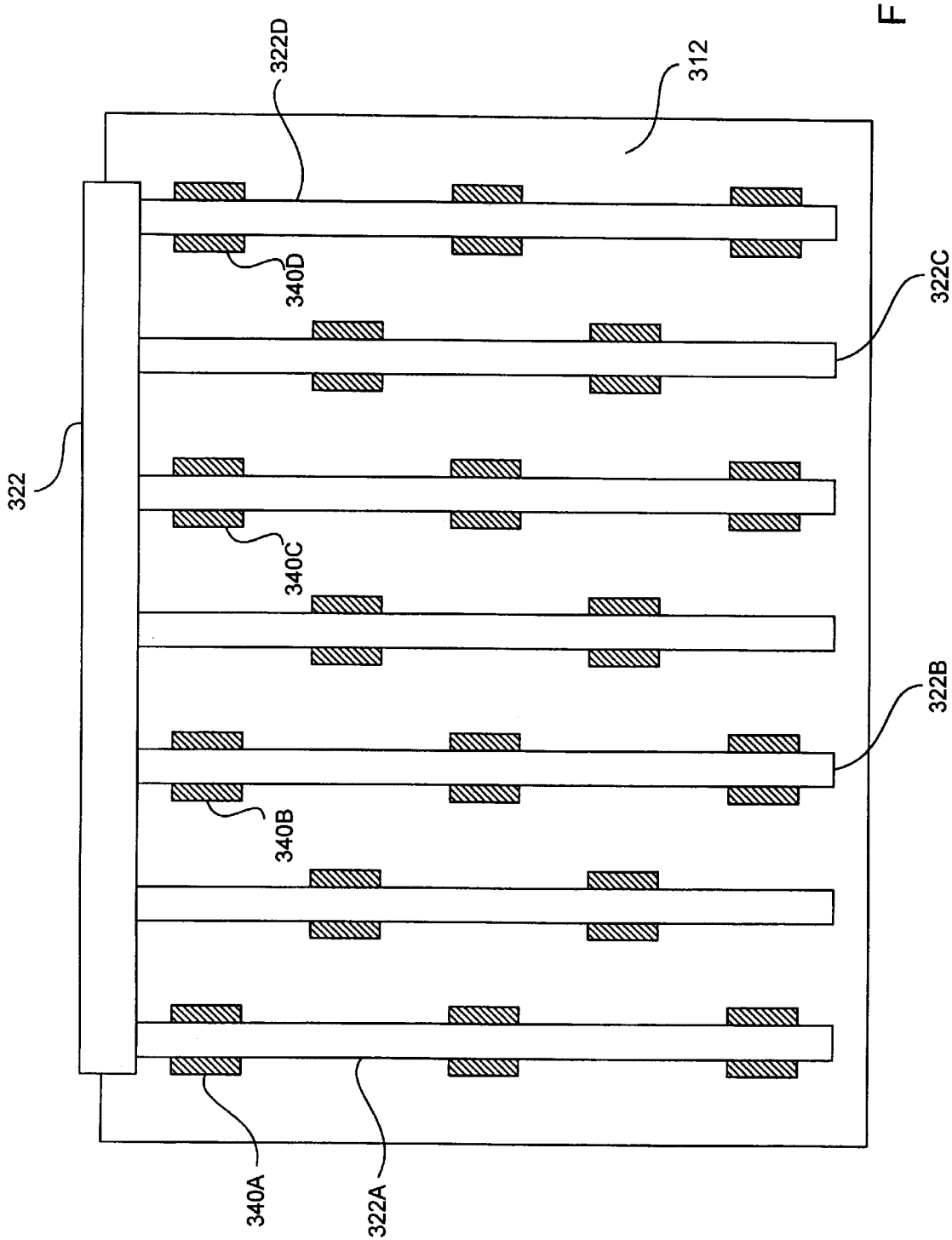
FIG. 6 is a top view of the photodiode of FIG. 5 featuring a contact having multiple connective traces electrically coupling together the distributed diffused regions.

Contact metal is added and etched to form contacts 322A–D that are electrically coupled to N+ regions 340A–D to obtain the structure shown in FIG. 4G. FIG. 4G is a substantially a partial cross sectional view, taken along the A axis shown in FIG. 5, of an embodiment of a distributed photodiode according to the present invention. FIG. 5 is a top view of the photodiode created by the process of FIGS. 4A–G and illustrates the distribution of N+ diffusions on the surface of fabrication wafer 312. FIG. 6 is a top view of the photodiode that includes contacts 322A–D that are part of a set of the connective traces that form contact 322 that connects the distributed N+ diffusion regions for coupling to an input terminal of a receiver. The semiconductor die can be cut from fabrication wafer 312 and handling wafer 330 to obtain individual distributed PN photodiodes.

The resulting distributed PN photodiode has a thinner P+ region 316 than can be obtained with conventional processes so that the thinner depletion region formed in the diode by lower reverse bias voltage levels will still permit high speed operation. Furthermore, the PN photodiodes produced in this manner can be formed using standard semiconductor fabrication processes, rather than photodiode specific processes, and can be fabricated on the same substrate as a receiver circuit coupled to the photodiode.

The multiple N-diffusions 340A–D shown in FIG. 4G are formed in P+ region 316 at regular intervals to form the PN junctions of the photodiode. The N-diffusions are formed from minimum geometry dots, shown in FIG. 5 as width W, spaced at a uniform distance, shown in FIG. 5 as D, from each other and are then connected together with minimum capacitance interconnects 322A–D, respectively, which can be formed using upper metal layer minimum geometry traces.

The junction dot spacing D is determined by the mean free carrier diffusion path and the maximum pulse decay time constant for the receiver. For example, if the mean free carrier diffusion path length is 155 microns and the diffusion velocity of carriers is 300 m/sec and if the N+ diffusion dots 340A–D are separated by 50 microns, then the maximum diffusion distance of light generated carriers to a junction dot is about 25 microns, i.e. 50 microns divided in half This means that the pulse decay time constant is approximately 1.2 $\mu$sec, the time for the carriers to diffuse 25 microns.

In a typical 0.8 micron BICMOS process, the minimum diffusion dot size is approximately 2×2 microns. If N+ diffusion dots 340A–D are placed every 50×50 microns, then the diffusion junction of the photodiode occupies less than 1/500th of the area of the photodiode. The resulting capacitance from the N-diffusion dots 340 to substrate 312 of the photodiode is about 1/80th of a comparably sized photodiode having a continuous N+ region. The capacitance to substrate 312 is larger than the junction area ratio due to the added capacitance of the minimum geometry metal interconnects 322A–D.

As noted above, FIG. 5 is a top view of the photodiode that illustrates the distribution of N-diffusion dots on a surface of fabrication wafer 312. N+ diffusion dots 340A–D are spaced at uniform distance D from one another. All the N+ diffusion dots are equally spaced and connected via connective traces 322A–D of contact 322, shown in FIG. 6, to form the photodiode. The distributed structure of the photodiode tends to extend the duration of the infrared pulse by about one half the carrier decay time constant, thus it is beneficial to reduce the output pulse width by this amount to restore the output pulses to the input pulse width. The spacing D of the N-diffusion dots 340A–D can be varied in order to adjust the response speed of the photodiode. In addition, commonly assigned, co-pending U.S. patent application Ser. No. 08/864,286 entitled APPARATUS AND METHOD FOR OUTPUT SIGNAL PULSE WIDTH ERROR CORRECTION IN A COMMUNICATIONS RECEIVER, herein incorporated for all purposes, describes a circuit and method which can be employed to normalize the pulse-width of the output pulse of a receiver connected to the photodiode of the present invention.

The connective traces 222A–D shown in FIGS. 2G and 3 and connective traces 322A–D shown in FIGS. 4G and 6 are typically metal strips that are approximately 1 micron wide and spaced at 40 micron intervals. The metal of the connective traces occupies approximately b 1/40 of the amount of surface that would be covered by a conductive layer for a conventional continuous photodiode. As a result, the connective traces present a smaller antenna for noise signal reception and capacitive coupling to a feedback signal from an output terminal of a receiver and external noise sources is also reduced. An advantage of the distributed diffusion dot method of the present invention is that its effective coupling capacitance to external noise sources and internal substrate RC coupling effects is significantly reduced.

However, by including a conductive backplane layer, either by adding a conductive layer or substituting a conductive layer for oxide layer 220 of FIGS. 2B–G, and oxide layer 320 of FIGS. 4B–G, the signal to noise ratio of the resulting photodiode can be further improved. The exposed portions of substrate 212 and 312 between the connective traces 222A–D and 322A–D that connect the distributed diffusion dots can act as an effective shield when the conductive backplane is grounded to form a grounded backplane 212 for the photodiode. Without the grounded backplane, the screen created by the metal interconnects would have similar coupling capacitance to external noise sources as a continuous conductor over the same area. However, in the present invention, the grounded backplane sets up an inverted induced noise signal which neutralizes the noise signal in the field around the connective traces. As a result, the only noise signal that remains to generate a noise difference signal in a receiver circuit is the 1/40th of the area of the grounded backplane that is shadowed by the connective traces.

It should be noted that the speed or bandwidth response of the dotted photodiode of the present invention is determined by the maximum carrier collection radius from the collecting diffusion dots. To a first order approximation, the speed of the photodiode is inversely proportional to the square of the maximum radius of carrier collection. This is due to the diffusion behavior of the photo-generated light carriers. In other words, carriers generated at twice the distance from the nearest collecting dot will take approximately four times longer to be collected since, on average, they will travel four times further on their diffusion path.

Two parameters determine the maximum carrier collecting radius for these diffusion dots, dot spacing and the light absorption depth. As an approximate rule for maximum speed without an undue increase in capacitance and/or a reduction in shielding, diffusion dot spacing should be about twice the light absorption depth since this makes the carrier collection radius distance approximately equal in both the lateral and vertical directions. For example, for an infrared photodiode, dot spacing should be about 50 microns since the light absorption depth is about 18–25 microns.

Although reducing the lateral dot spacing reduces the lateral collection radius it does not reduce the vertical (depth) collection radius. However, if the intrinsic layer 216 or 316 can be fabricated with a depth of one half the light absorption depth and if a highly reflective layer is formed on the backside of the diode, i.e. make the grounded backplane add to or substituted for oxide layers 220 and 320 out of a reflective material, then the light absorption path will be at least equal to the light absorption depth but the vertical carrier collection radius will be reduced by one half.

Consequently, when a thin reflective layer is formed in the photodiode according to the present invention, the preferred dot spacing rule is to make the distributed diffusion dot spacing equal to the light absorption depth and make the substrate equal to one half the light absorption depth. The reflective layer can be formed by adding a reflective layer, forming a refractive reflective layer, or making the grounded backplane or other structure added to or substituted for oxide layer 220 or 320 reflective. When this approach is applied to an infrared photodiode, for example, the distributed diffusion dot spacing should be about 25 microns, the intrinsic layer 216 or 316 should be about 12.5 microns deep. Such an infrared photodiode would be about four times faster or have about four times the bandwidth than a distributed photodiode having 50 micron spacing between distributed diffusion dots. Whereas the process according to the present invention can be used to produce a distributed photodiode having an intrinsic region on this order of thickness, it is highly impractical in conventional methods to lap or handle wafers of less than 100–125 microns in thickness.

Finally, even if the backside of the thin active substrate is not reflective, there are significant benefits to such a dotted photodiode constructed on a very thin substrate. Without the reflective backside, the light collection efficiency will drop to 60% of that of a substrate with a reflector. However, in many applications where a wide viewing angle is desirable, such a thin substrate photodiode without a backside reflector will have relatively flat optical output as the light angle of incidence moves away from perpendicular relative to the surface of the photodiode. For light entering the silicon substrate at an angle of incidence of less than 90 degrees, the light path length increases offsets much of the drop in effective light collecting area for angles of more than 30 degrees.

For example, for light falling on the surface of the photodiode at an angle of 60 degrees from perpendicular, the effective collection area falls to one half (cosine of angle), but the optical path length increases by two times, which increases absorption by 60% for a thin substrate with a depth equal to one-half the light absorption depth. An identical photodiode with 100% reflection from the backside of the substrate would only output 23% more for light incident at the same 60 degree angle from perpendicular, although the output would be 66% more at 0 degrees from perpendicular.

It should be noted that, while the processes above are illustrated in the context of a single distributed PN photodiode, the processes are preferably applied to rows of multiple photodiodes formed on the fabrication wafer. The fabrication wafer bonded to handle wafer is diced in order to obtain the individual photodiode die.

Having illustrated and described the principles of the present invention in the context of the embodiments described above, it should be readily apparent to those of ordinary skill in the art that the invention can be modified in arrangement and detail without departing from such principles. It will be readily understood by one of ordinary skill in the art that while the present invention is discussed in the context of producing a distributed PN photodiode, the present invention is applicable to other semiconductor devices and processes without departing from the scope and spirit of the present invention. We claim all modifications and variations coming within the spirit and scope of the present invention.

We claim:

1. A method for fabricating a distributed PN photodiode, the method comprising the steps of:
   providing a first semiconductor substrate doped with a first dopant type, the first semiconductor substrate having first and second planar surfaces;
   bonding a first surface of a second semiconductor substrate to the first planar surface of the first semiconductor substrate;
   lapping the second planar surface of the first semiconductor substrate;
   selectively masking and diffusing a predetermined portion of the second planar surface of the first semiconductor substrate with a second dopant type to form a plurality of active regions:
   forming a first oxide layer on the second planar surface of the first semiconductor substrate;
   selectively masking and etching the first oxide layer to form a plurality of contact holes in the first oxide layer, where each contact hole is formed in communication with one of the plurality of active regions; and
   forming a contact that interconnects each of the plurality of contact holes.

2. The method of claim 1, further including the step of forming a second oxide layer on one of the first planar surface of the first semiconductor substrate and the first planar surface of the second semiconductor substrate.

3. The method of claim 2, wherein the step of forming a second oxide layer includes controlling a thickness of the second oxide layer to form a dielectric interference reflector.

4. The method of claim 1, further including the step of forming a conductive layer on one of the first planar surface of the first semiconductor substrate and the first planar surface of the second semiconductor substrate.

5. The method of claim 1, wherein the step of forming a contact that interconnects each of the plurality of contact holes includes forming a contact having a plurality of traces, where the plurality of traces interconnect the plurality of contact holes.

6. The method of claim 1, where the first dopant type further comprises a P dopant type and the second dopant type further comprises an N dopant type.

7. The method of claim 1, where the first dopant type further comprises an N dopant type and the second dopant type further comprises a P dopant type.

8. A method for producing a distributed PN photodiode, the method comprising the steps:
   doping a first semiconductor substrate with a first dopant type, the first semiconductor substrate having first and second planar surfaces;
   forming a first oxide layer on one of the first surface of the first semiconductor substrate and a first surface of a second semiconductor substrate;
   bonding the first surface of the second semiconductor substrate to the first planar surface of the first semiconductor substrate;
   lapping the second planar surface of the first semiconductor substrate to a predetermined thickness;
   forming a plurality of active regions in a selected portion of the second planar surface of the first semiconductor substrate with a second dopant type;
   forming a second oxide layer on the second planar surface of the first semiconductor substrate;
   forming a plurality of contact openings in the second oxide layer, where each of the contact openings is adjacent one of the active regions; and
   forming a contact having a plurality of connection traces, where the connection traces are formed along the plurality of contact opening so as to electrically couple each of the plurality of second active regions to the contact.

9. The method of claim 8, wherein the step of forming a first oxide layer includes controlling a thickness of the first oxide layer to form a dielectric interference reflector.

10. The method of claim 8, the method further including the step of forming a conductive layer on one of the first surface of the first semiconductor substrate and the first surface of the second semiconductor substrate.

11. The method of claim 1, the method further including the step of forming a contact that connects to the first semiconductor substrate for coupling to a receiver circuit formed on the first semiconductor substrate.

* * * * *